United States Patent
Shimazawa et al.

(10) Patent No.: US 6,451,215 B1
(45) Date of Patent: Sep. 17, 2002

(54) METHOD OF PRODUCING MAGNETO-RESISTIVE TUNNEL JUNCTION HEAD

(75) Inventors: Koji Shimazawa; Satoru Araki; Haruyuki Morita, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/542,907

(22) Filed: Apr. 4, 2000

(30) Foreign Application Priority Data

Jul. 23, 1999 (JP) .......................................... 11-208440

(51) Int. Cl.⁷ .............................................. H01L 43/00
(52) U.S. Cl. ................... 216/22; 216/75; 438/3; 438/720; 134/1.1; 134/2; 360/313; 360/324.2; 427/56
(58) Field of Search .............................. 216/58, 75, 22; 438/3, 720; 134/1, 1.1, 2; 360/313, 324.2, 126; 428/678; 427/156

(56) References Cited

U.S. PATENT DOCUMENTS

| | | | |
|---|---|---|---|
| 5,159,513 A | 10/1992 | Dieny et al. | |
| 5,366,815 A | 11/1994 | Araki et al. | |
| 5,510,172 A | 4/1996 | Araki et al. | |
| 5,514,452 A | 5/1996 | Araki et al. | |
| 5,657,190 A | 8/1997 | Araki et al. | |
| 5,661,449 A | 8/1997 | Araki et al. | |
| 5,712,612 A * | 1/1998 | Lee et al. .................... | 324/252 |
| 5,736,236 A | 4/1998 | Araki et al. | |
| 5,783,284 A | 7/1998 | Shinjo et al. | |
| 5,789,069 A | 8/1998 | Araki et al. | |
| 5,798,896 A | 8/1998 | Araki et al. | |
| 5,862,022 A | 1/1999 | Noguchi et al. | |
| 5,874,886 A | 2/1999 | Araki et al. | |
| 5,968,676 A | 10/1999 | Araki et al. | |
| 6,004,654 A | 12/1999 | Shinjo et al. | |
| 6,097,579 A * | 8/2000 | Gill .......................... | 360/324.2 |
| 6,153,443 A * | 11/2000 | Durlam et al. ............... | 257/295 |
| 6,174,736 B1 * | 1/2001 | Tsukamoto et al. .......... | 428/610 |
| 6,327,107 B1 * | 12/2001 | Komuro et al. ........... | 360/324.2 |
| 6,330,137 B1 * | 12/2001 | Knapp et al. ............. | 360/324.2 |

* cited by examiner

*Primary Examiner*—Randy Gulakowski
*Assistant Examiner*—J. Smetana
(74) *Attorney, Agent, or Firm*—Oblon, Spivak, McClelland, Maier & Neustadt, P.C.

(57) ABSTRACT

The present invention relates to a method of producing a magneto-resistive tunnel junction head comprising a tunnel multilayered film having a tunnel barrier layer, a ferromagnetic free layer and a ferromagnetic pinned layer such that the tunnel barrier layer is held between the ferromagnetic free layer and the ferromagnetic pinned layer. The method comprises a laminating step of forming the tunnel barrier layer and a non-magnetic metal protect layer in turn on the ferromagnetic pinned layer, an insulating layer forming step of forming side insulating layers on both sides of a lamination body having the ferromagnetic pinned layer, the tunnel barrier layer and the non-magnetic metal protect layer, a cleaning step of cleaning the surface of the non-magnetic metal protect layer, and a ferromagnetic free layer forming step of forming the ferromagnetic free layer such that the ferromagnetic free layer faces the ferromagnetic pinned layer via the cleaned surface. Therefore, according to the method, the magneto-resistive tunnel junction head is expected to have more improved head characteristics.

19 Claims, 6 Drawing Sheets

RESISTANCE $R_p$

RESISTANCE $R_m$

RESISTANCE $R_{ap}$

RESISTANCE $R'_p$

RESISTANCE $R'_{ap}$

METHOD OF PRODUCING MAGNETO-RESISTIVE TUNNEL JUNCTION HEAD

BACKGROUND OF THE INVENTION

1. Field of the Invention

The present invention relates to a method of producing a magneto-resistive tunnel junction head for reading the magnetic field intensity from a magnetic recording medium or the like as a signal. In particular, the present invention relates to a method of producing a magneto-resistive tunnel junction head in which a higher output can be obtained for allowing the application of the head to ultra-high density magnetic recording.

2. Description of the Related Art

MR sensors based on the anisotropic magneto-resistance (AMR) or spin-valve (SV) effect are widely known and extensively used as read transducers in magnetic recording. MR sensors can probe the magnetic stray field coming out from transitions recorded on a recording medium by the resistance changes of a reading portion formed of magnetic materials. AMR sensors have quite a low resistance change ratio $\Delta R/R$, typically from 1 to 3%, whereas the SV sensors have a $\Delta R/R$ ranging from 2 to 7% for the same magnetic field excursion. The SV magnetic read heads showing such high sensitivity are progressively supplanting the AMR read heads to achieve very high recording density, namely over several Giga bits per square inch (Gbits/in$^2$).

Recently, a new MR sensor has attracted attention for its application potential in ultra-high density recording. Magneto-resistive tunnel junctions (MRJT, or synonymously referred to as TMR) are reported to have shown a resistance change ratio $\Delta R/R$ over 12%. Although it has been expected that TMR sensors replace SV sensors in the near future as the demand for ultra-high density is ever growing, an application to the field of the magnetic heads has just started, and one of the outstanding objects is to develop a new head structure which can maximize the TMR properties. Great efforts of developments are still needed to design a new head structure since TMR sensors operate in CPP (Current Perpendicular to the Plane) geometry, which means that TMR sensors requires the current to flow in a thickness direction of a laminate film.

In a basic SV sensor which has been developed for practical applications, two ferromagnetic layers are separated by a non-magnetic layer, as described in U.S. Pat. No. 5,159,513. An exchange layer (FeMn) is further provided so as to be adjacent to one of the ferromagnetic layers. The exchange layer and the adjacent ferromagnetic layer are exchange-coupled so that the magnetization of the ferromagnetic layer is strongly pinned (fixed) in one direction. The other ferromagnetic layer has its magnetization which is free to rotate in response to a small external magnetic field. When the magnetization of the ferromagnetic layers are changed from a parallel to an antiparallel configuration, the sensor resistance increases and a $\Delta R/R$ in the range of 2 to 7% is observed.

In comparison between the SV sensor and the TMR sensor, the structure of the TMR is similar to the SV sensor except that the non-magnetic layer separating the two ferromagnetic layers is replaced by a tunnel barrier layer being an insulating layer and that the sense current flows perpendicular to the surfaces of the ferromagnetic layers. In the TMR sensor, the sense current flowing through the tunnel barrier layer is strongly dependent upon a spin-polarization state of the two ferromagnetic layers. When the magnetization of the two ferromagnetic layers are antiparallel to each other, the probability of the tunnel current is lowered, so that a high junction resistance is obtained. On the contrary, when the magnetization of the two ferromagnetic layers are parallel to each other, the probability of the tunnel current is heightened and thus a low junction resistance is obtained. The inventors of the present invention have attempted to design TMR heads the constructions of which are similar to those of SV heads. One of these head constructions is shown in FIG. 5. The TMR head 100 shown in FIG. 5 comprises a TMR element 200 having a laminate structure composed of a ferromagnetic free layer 120, a tunnel barrier layer 130, a ferromagnetic pinned layer 140, and an antiferromagnetic pinning layer 150. Insulating layers 191 and 191 are externally formed on the opposite ends (left and right directions of the drawing paper) of the TMR element 200. The ferromagnetic pinned layer 140 is pinned such that its magnetization direction is fixed in one direction (a depth direction of the drawing sheet), and the ferromagnetic free layer 120 can change its magnetization direction freely in response to an external signal magnetic field.

Biasing layers 161 and 161, for applying a bias magnetic field in the direction of the arrow ($\alpha$), are formed on the upper surface of both ends of the ferromagnetic free layer 120, which is disposed at an upper portion of the TMR element 200. The biasing layers 161 and 161 are composed of permanent magnet, for example. Thus, at portions where the biasing layers 161 contact with the upper surface of the ferromagnetic free layer 120, the magnetization direction of the ferromagnetic free layer 120 is pinned in the direction of the arrow ($\alpha$) by the exchange coupling magnetic field. In FIG. 5, numerals 171, 175 represent a pair of upper and the lower electrodes, and numerals 181, 185 represent a pair of upper and the lower shield layers.

It was confirmed that an effective bias magnetic field was applied to the ferromagnetic free layer 120 by employing the head construction shown in FIG. 5. However, the present inventors found that the following problems to be solved were raised in the head construction shown in FIG. 5.

Specifically, the TMR effect is a phenomenon that when a current is applied in a laminate direction between a pair of ferromagnetic layers (a ferromagnetic pinned layer and a ferromagnetic free layer) sandwiching a tunnel barrier layer therebetween, a tunnel current flowing in the tunnel barrier layer changes depending on a relative angle of magnetization between the ferromagnetic layers. The tunnel barrier layer is a thin insulation film which allows electrons to pass therethrough while keeping spin due to the magneto-resistive tunnel junction effect.

Therefore, as shown in FIG. 4A, when the ferromagnetic pinned layer and the ferromagnetic free layer are parallel in magnetization to each other, the tunneling probability is increased so that the resistance to current flowing therebetween is decreased (resistance value Rp).

In contrast, as shown in FIG. 4C, when both ferromagnetic layers are antiparallel in magnetization to each other, the tunneling probability is lowered, thus, the resistance to current flowing therebetween is increased (resistance value Rap).

In the intermediate state between the state shown in FIG. 4A and the state shown in FIG. 4C, i.e. when both ferromagnetic layers are orthogonal in magnetization to each other, a resistance value Rm takes a value between the resistance value Rp and the resistance value Rap so that a relation of Rp<Rm<Rap is satisfied.

It was found through experiments implemented by the present inventors that an unfavorable phenomenon as shown in FIGS. 6A and 6B was generated between the ferromagnetic pinned layer and the ferromagnetic free layer in the head structure shown in FIG. 5. Specifically, as shown in FIG. 6A, when the magnetization directions of the ferromagnetic pinned layer 140 and the free layer 120 are basically parallel to each other, magnetization in both end portions 120a and 120a of the free layer 120 is fixed in the direction of arrow α due to the exchange-coupling relative to the bias layers as described above. If a sense current i is caused to flow in the laminate direction in this state, the current mainly flows at the center portions of the layers where the magnetization directions are parallel to each other and thus the resistance is small. The total resistance value at this time is given by R'p. On the other hand, as shown in FIG. 6B, when the magnetization directions of the ferromagnetic pinned layer 140 and the free layer 120 are basically antiparallel to each other (also in this case, the magnetization in the end portions 120a and 120a of the free layer 120 is fixed in the direction of arrow a due to the exchange-coupling relative to the bias layers as described above), if a sense current i is caused to flow in the laminate direction, the current does not mainly flow at the antiparallel center portions of the layers, but branches to mainly flow at both end portions where the resistance is small (currents is and is). The total resistance value in FIG. 6B is given by R'ap.

The resistance change ratio ((R'ap-R'p)/R'p) upon transition from the state of FIG. 6B to the state of FIG. 6A is smaller than the resistance change ratio (Rap-Rp)/Rp) upon transition from the state of FIG. 4C to the state of FIG. 4A. As a result, there is raised a serious problem that the TMR (change) ratio is considerably lowered.

As to such a problem, a magneto-resistive tunnel junction head has been proposed in Japanese patent application No. H11-171869, which can prevent a phenomenon wherein the current does not mainly flow at the antiparallel center portions of the layers but branches to mainly flow at both end portions where the resistance is low (the present inventors call this phenomenon "extra current channel effect" or "three current channel effect"), so as to achieve a high head output for adaptation to ultrahigh density recording with less reduction in TMR ratio. Specifically, there has been a proposal for a magneto-resistive tunnel junction head having a tunnel multilayered film composed of a tunnel barrier layer, and a ferromagnetic free layer and a ferromagnetic pinned layer formed to sandwich the tunnel barrier layer therebetween, wherein a length of the ferromagnetic free layer in the longitudinal direction (bias magnetic field applying direction) thereof is set to be greater than a longitudinal length of the ferromagnetic pinned layer such that the ferromagnetic free layer is provided at the longitudinal opposite ends thereof with extended portions extending further beyond longitudinal opposite ends of the ferromagnetic pinned layer.

Under the circumstances, a further proposal has been demanded which can further improve a head characteristic of a magnet-resistive tunnel junction head having an element with a particular design such that a length of a ferromagnetic free layer in the longitudinal direction (bias magnetic field applying direction) thereof is set to be greater than a longitudinal length of a ferromagnetic pinned layer.

SUMMARY OF THE INVENTION

For solving the foregoing problems, according to one aspect of the present invention, there is provided a method of producing a magneto-resistive tunnel junction head comprising a tunnel multilayered film having a tunnel barrier layer, a ferromagnetic free layer and a ferromagnetic pinned layer such that the tunnel barrier layer is held between the ferromagnetic free layer and the ferromagnetic pinned layer, the method comprising a laminating step of forming the tunnel barrier layer and a non-magnetic metal protect layer in turn on the ferromagnetic pinned layer; an insulating layer forming step of forming side insulating layers on both sides of a lamination body having the ferromagnetic pinned layer, the tunnel barrier layer and the non-magnetic metal protect layer; a cleaning step of cleaning the surface of the non-magnetic metal protect layer; and a ferromagnetic free layer forming step of forming the ferromagnetic free layer such that the ferromagnetic free layer faces the ferromagnetic pinned layer via the cleaned surface.

According to another aspect of the present invention, there is provided a method of producing a magneto-resistive tunnel junction head comprising a tunnel multilayered film having a tunnel barrier layer, a ferromagnetic free layer and a ferromagnetic pinned layer such that the tunnel barrier layer is held between the ferromagnetic free layer and the ferromagnetic pinned layer, wherein the ferromagnetic free layer is applied with a bias magnetic field in a longitudinal direction thereof by biasing means disposed at and connected to longitudinal opposite ends thereof, and wherein a length of the ferromagnetic free layer in the longitudinal direction (bias magnetic field applying direction) thereof is set to be greater than a longitudinal length of the ferromagnetic pinned layer such that the ferromagnetic free layer is provided at the longitudinal opposite ends thereof with extended portions extending further beyond longitudinal opposite ends of the ferromagnetic pinned layer, the method comprising a laminating step of forming the tunnel barrier layer and a non-magnetic metal protect layer in turn on the ferromagnetic pinned layer; an insulating layer forming step of forming side insulating layers on both sides of a lamination body having the ferromagnetic pinned layer, the tunnel barrier layer and the non-magnetic metal protect layer; a cleaning step of cleaning the surface of the non-magnetic metal protect layer; a ferromagnetic free layer forming step of forming the ferromagnetic free layer such that the ferromagnetic free layer faces the ferromagnetic pinned layer via the cleaned surface; and a biasing means forming step of providing the biasing means such that the biasing means are disposed at and connected to both longitudinal opposite ends of the ferromagnetic free layer.

It is preferable that the cleaning step is carried out with a dry etching technique until the non-magnetic metal protect layer is completely removed.

It is preferable that the cleaning step is carried out with a dry etching technique until portions of the non-magnetic metal protect layer remain like islands.

It is preferable that the non-magnetic metal protect layer is made of at least one selected from Cu, Ag, Au and Al.

It is preferable that the thickness of the non-magnetic metal protect layer is set to be in the range of 20 to 100 Å.

It is preferable that the biasing means are located at the longitudinal opposite ends of the ferromagnetic free layer are contacted with upper or lower portions of the extended portions located at the longitudinal opposite ends of the ferromagnetic free layer, and that each of the biasing means is located with a predetermined space (D) from corresponding one of the longitudinal opposite ends of the ferromagnetic pinned layer, the space (D) being set to no less than 0.02 μm.

It is preferable that the space (D) is set to no less than 0.02 μm and no greater than 0.3 μm.

It is preferable that the space (D) is set to no less than 0.02 μm and less than 0.15 μm.

It is preferable that a pinning layer for pinning magnetization of the ferromagnetic pinned layer is stacked on a surface of the ferromagnetic pinned layer remote from a side thereof abutting the tunnel barrier layer.

It is preferable that the tunnel multilayered film is electrically contacted with a pair of electrodes which are disposed to sandwich the tunnel multilayered film therebetween.

It is preferable that a pair of shield layers are formed to sandwich the pair of electrodes therebetween.

DETAILED DESCRIPTION OF THE INVENTION

Figure 1A:
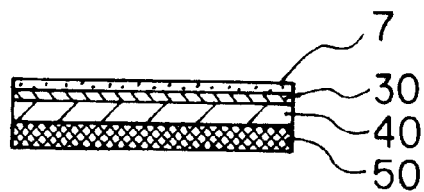
FIGS. 1A to 1C are sectional views showing, with a lapse of time, an example of a preferred manufacturing process of a magneto-resistive tunnel junction head according to the present invention.

Hereinbelow, preferred embodiments of the present invention will be described in detail.

FIGS. 1A–1C and 2A–2D are sectional views showing, with a lapse of time, an example of a preferred manufacturing process of a magneto-resistive tunnel junction head (hereinafter simply referred to as "TMR head") according to the present invention. FIG. 3 is a sectional view generally showing a TMR head 1 produced by a manufacturing process of the present invention. This sectional view corresponds to a surface that is located in a confronting relationship to a magnetic recording medium which produces an external magnetic field as magnetic information. This surface is generally called an ABS (Air Bearing Surface). For easy understanding of the producing method of the present invention, FIG. 3 is shown as a sectional view similar to FIG. 2D, therefore, in FIG. 3, added members are shown in two-dot chain lines.

Before explaining the producing method of the TMR head of the present invention, an example of the construction of the TMR head 1 is explained with reference to FIG. 3. As shown in FIG. 3, the TMR head 1 has a tunnel multilayered film 3 which exhibits a magneto-resistive spin tunnel junction effect. Specifically, the tunnel multilayered film 3 has a laminate structure composed of a tunnel barrier layer 30, a ferromagnetic free layer 20 formed on one surface of the tunnel barrier layer 30, and a ferromagnetic pinned layer 40 formed on the other surface of the tunnel barrier layer 30 so that the tunnel barrier layer 30 is held between the layers 20 and 40. The ferromagnetic free layer 20 can basically change its magnetization direction freely in response to an external magnetic field as magnetic information. On the other hand, the ferromagnetic pinned layer 40 is pinned such that its magnetization direction is entirely fixed in one direction (in FIG. 3, the pinned magnetization direction is in a depth direction of the drawing sheet). Thus, as shown in FIG. 3, a pinning layer 50 for pinning the magnetization of the ferromagnetic pinned layer 40 is stacked on a surface of the ferromagnetic pinned layer 40 remote from a surface thereof abutting the tunnel barrier layer 30.

The tunnel multilayered film 3 is preferably formed such that its multilayered film detection end surface constitutes an ABS (Air Bearing Surface).

As shown in FIG. 3, the ferromagnetic free layer 20 in the present invention is formed such that a bias magnetic field (for example, in the direction of arrow α1) is applied in the longitudinal direction of the ferromagnetic free layer 20 by biasing means 61 and 61 which are stacked at longitudinally opposite ends (left and right directions of the drawing sheet) of the ferromagnetic free layer 20.

A length $L_f$ in the longitudinal direction (substantially the same as the bias magnetic field applying direction) of the ferromagnetic free layer 20 is set to be greater than a longitudinal length $L_p$ of the ferromagnetic pinned layer 40. The ferromagnetic free layer 20, which is longer than the ferromagnetic pinned layer 40 as described above, has extended portions 20a extending further beyond the longitudinal ends (designated by lines h) of the ferromagnetic pinned layer 40. Each of the extended portions 20a has a length $L_{fe}$ and occupies a part of the ferromagnetic free layer 20, which means that the extended portion 20a is synonymous to a projected length extending further from the end of the ferromagnetic pinned layer 40.

The longitudinal length $L_f$ of the ferromagnetic free layer 20 is set to be in the range of 0.5 to 20 μm, for example. The length $L_{fe}$ of the extended portion 20a of the ferromagnetic free layer 20, which is determined in relation to the longitudinal length $L_p$ of the ferromagnetic pinned layer 40, is set to be in the range of 0.1 to 5 μm.

The foregoing biasing means 61 and 61 are contacted in a laminate state with the extended portions 20a and 20a at the opposite ends of the ferromagnetic free layer 20. Since the biasing means 61 and 61 are in exchange-coupling to the extended portions 20a and 20a, the magnetization direction is fixed in the direction shown by arrow α1. Each of the biasing means 61 and 61 is formed such that a predetermined space D is maintained from the corresponding longitudinal end of the ferromagnetic pinned layer 40, as shown in FIG. 3.

The space D is necessary for preventing an influence of "extra current channel effect" or "three current channel effect" being the conventional problem found by the present inventors so as to avoid lowering of the TMR ratio. Upon determining the head specification, the value of D should be set to a length which does not cause substantial lowering of the TMR ratio characteristics. It is preferable that the specific value is set depending on the head specification, such as materials and dimensions of components to be used. As a preferred example, the space D is set to be no less than 0.02 μm, particularly in the range of 0.02 μm to 0.3 μm, and more preferably, in the range of 0.02 μm to less than 0.15 μm. If the value of D is less than 0.02 μm, the foregoing "extra current channel effect" phenomenon tends to be caused to lower the TMR ratio. In contrast, if the value of D increases to exceed 0.3 μm, an effective track width is unfavorably expanded to result in failure to meet with the requirement of high density recording in the future. If a concentrated attention is paid to the effective track width, the D value is preferably set to be in the range of no less than 0.02 μm to less than 0.15 μm.

The thickness of the ferromagnetic free layer 20 in the present invention is set to be 20 to 500 Å, preferably 40 to 300 Å, and more preferably 60 to 200 Å. If the thickness is less than 20 Å, it is difficult to set the length $L_f$ of the ferromagnetic free layer 20 to be sufficiently large in view of the film formation technique. If the thickness exceeds 500 Å, dispersion of electronic polarizability is produced due to property variance within the ferromagnetic free layer, resulting in reduction of the TMR ratio.

In the TMR head 1 shown in FIG. 3, the tunnel multilayered film 3 is electrically contacted with a pair of electrodes 71 and 75 which are disposed so as to sandwich the tunnel multilayered film 3 therebetween in upper/lower directions in FIG. 3. Further, a pair of shield layers 81 and 85 are formed so as to sandwich the pair of electrodes 71 and 75 therebetween in upper/lower directions in FIG. 3 so that a gap length is determined. In this embodiment, insulating layers 93 and 93, for example made of alumina, are externally formed on the opposite ends of the ferromagnetic pinned layer 40 and the tunnel barrier layer 30 as shown in FIG. 3.

Each of the ferromagnetic free layer 20 and the ferromagnetic pinned layer 40 is made preferably of a high spin polarization material, such as Fe, Co, Ni, FeCo, NiFe, CoZrNb or FeCoNi for the purpose of obtaining the high TMR ratio. It may be in the form of a laminate body having two or more layers. The thickness of the ferromagnetic pinned layer 40 is set to be 10 to 100 Å, preferably 20 to 50 Å. If the thickness is more than required, the pinning of magnetization by the pinning layer 50 is weakened and, on the other hand, if it is less than required, the TMR ratio tends to reduce.

The pinning layer 50 for pinning the magnetization of the ferromagnetic pinned layer 40 is normally made of an antiferromagnetic material, although not limited thereto as long as exhibiting a pinning function. The thickness of the pinning layer 50 is normally set in the range of 60 to 300 Å.

Figure 3:
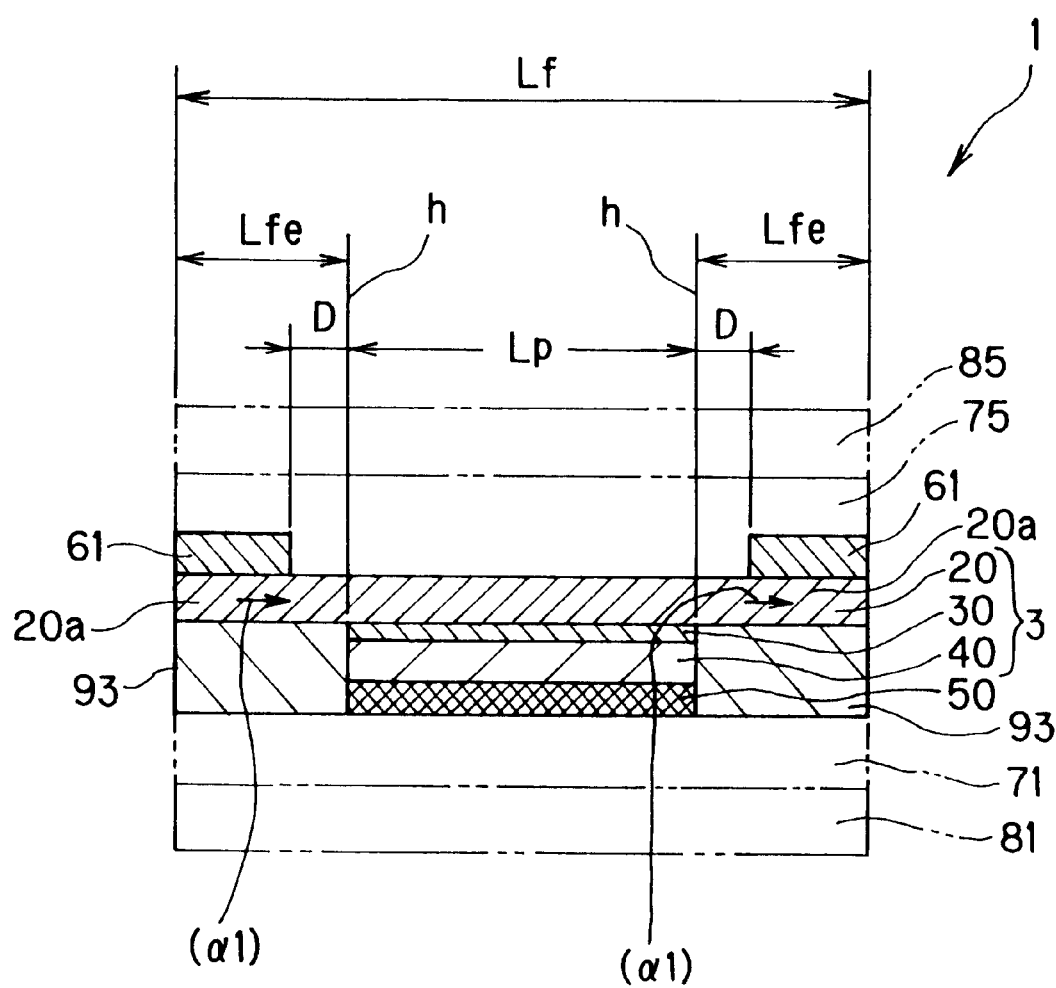
FIG. 3 is a sectional view showing an example of a preferred manufacturing process of a magnet-resistive tunnel junction head according to the present invention.
Figure 4A:
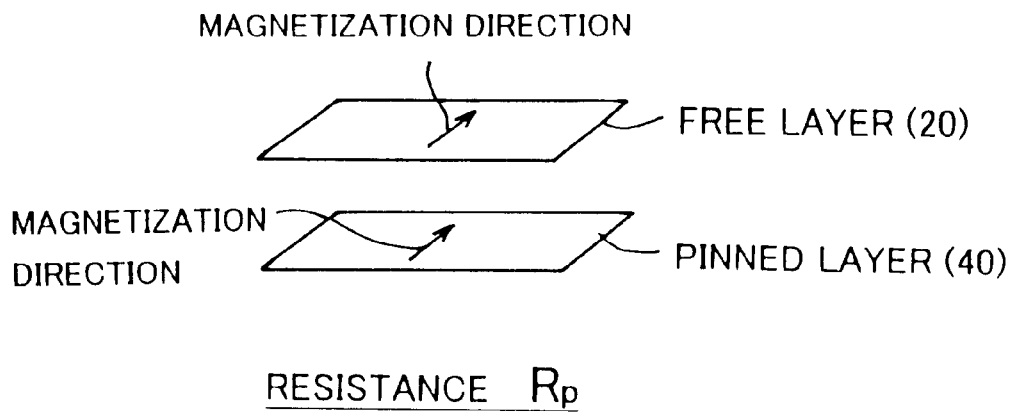
FIGS. 4A to 4C are diagrams for explaining a magneto-resistive tunnel junction effect according to the present invention.
Figure 4B:
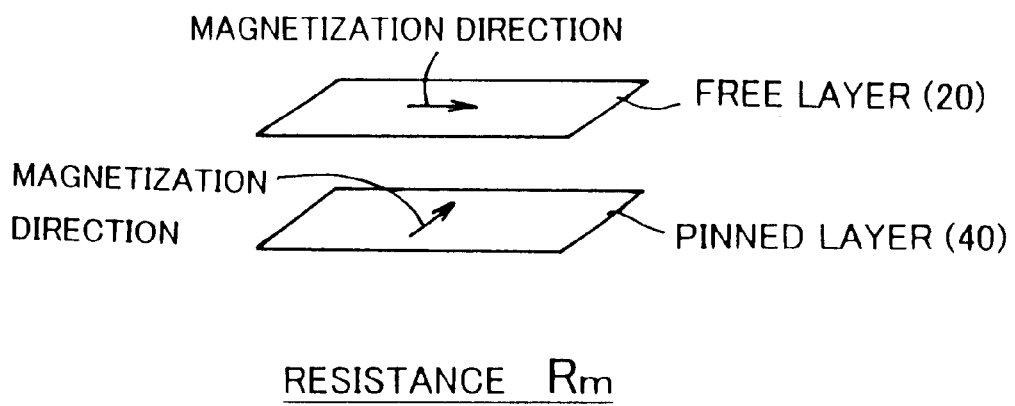
Figure 4C:
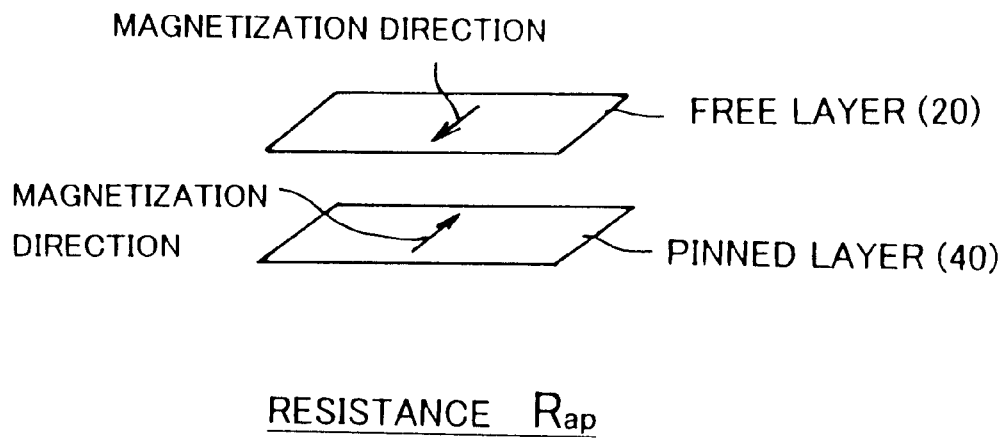
Figure 5:
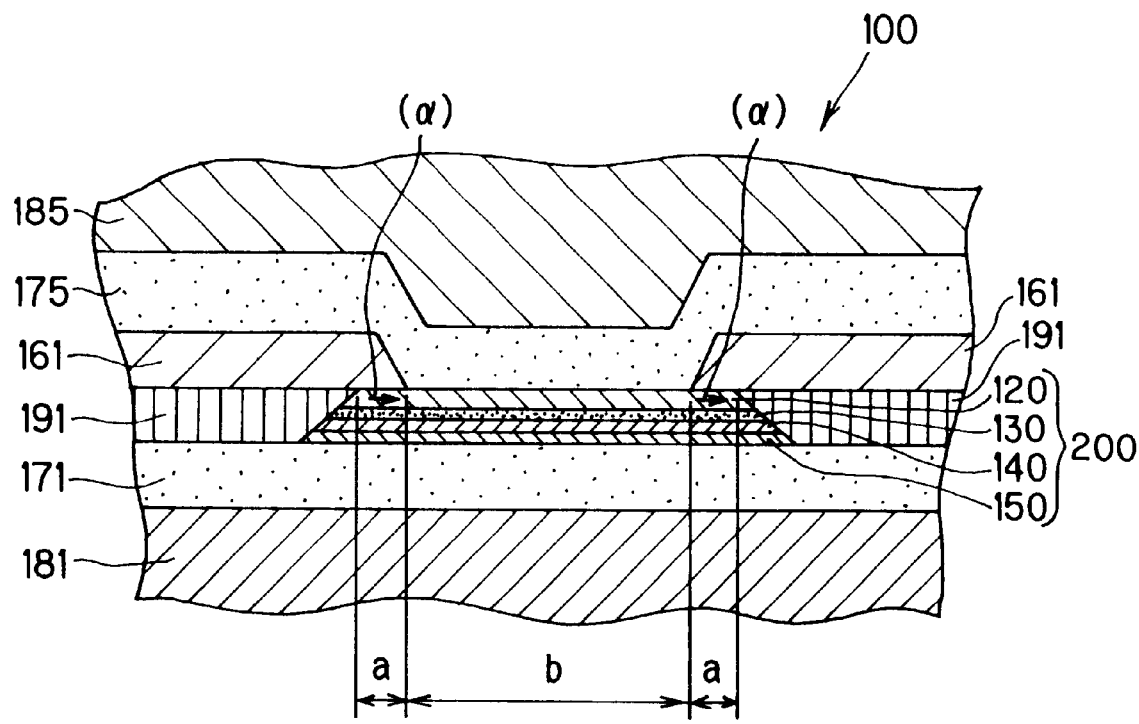
FIG. 5 is a sectional view of a conventional magneto-resistive tunnel junction head.
Figure 6A:
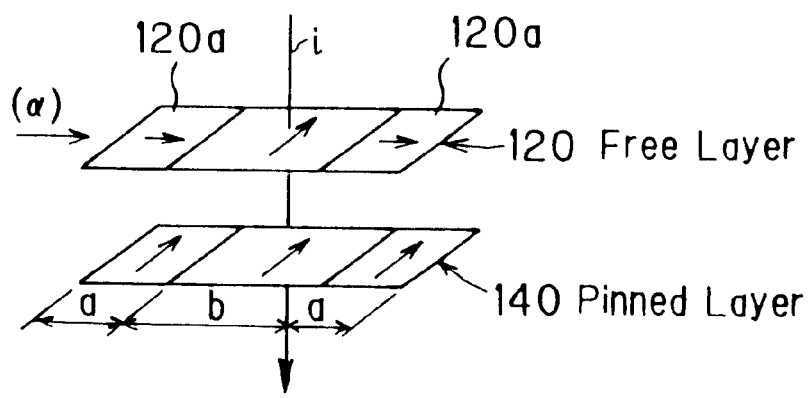
FIGS. 6A and 6B are diagrams for explaining a problem of the conventional head.
Figure 6B:
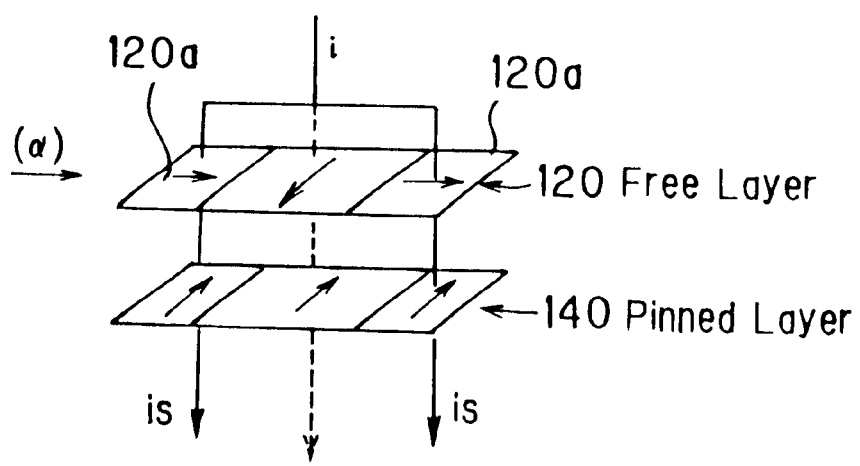

Now, the ferromagnetic magneto-resistive tunnel junction effect will be briefly explained with reference to FIGS. 3, and 4A–4C. The ferromagnetic magneto-resistive tunnel junction effect is, as shown in FIG. 3, a phenomenon that when a current is applied in the laminate direction between the ferromagnetic layers 20 and 40 sandwiching the tunnel barrier layer 30, a tunnel current flowing in the tunnel barrier layer 30 changes depending on a relative angle of magnetization between the ferromagnetic layers 20 and 40. In this case, the tunnel barrier layer 30 is a thin insulation film which allows electrons to pass therethrough while keeping spin due to the magneto-resistive tunnel junction effect. As illustrated in FIG. 4A, when the ferromagnetic layers 20 and 40 are parallel in magnetization to each other (or a relative magnetization angle therebetween is small), the tunnel probability of electrons is increased and, therefore, the resistance of the current flowing between the ferromagnetic layers 20 and 40 is decreased. In contrast with this, as illustrated in FIG. 4C, when the ferromagnetic layers 20 and 40 are antiparallel in magnetization to each other (or a relative magnetization angle therebetween is large), the tunnel probability of electrons is lowered so that the resistance of the current flowing therebetween is increased. By utilizing the change in resistance depending on the change in relative magnetization angle, an external magnetic field is detected, for example.

The tunnel barrier layer 30 sandwiched between the two ferromagnetic layers 20 and 40 is formed of $Al_2O_3$, NiO, GdO, MgO, $Ta_2O_5$, $MoO_2$, $TiO_2$, $WO_2$ or the like. The thickness of the tunnel barrier layer 30 is desired to be as thin as possible for reducing the resistance of the element. However, if the thickness becomes thin enough to cause pin holes, a leak current is generated, which is not preferable. In general, the thickness is set to about 5 to 20 Å.

As one preferred example of the present invention, the ferromagnetic free layer 20 may be in the form of a synthetic ferrimagnet of a three-layered laminate body of NiFe layer (20 Å in thickness)/Ru layer (7 Å in thickness)/NiFe layer (25 Å in thickness). In this example, magnetization directions of the NiFe layers are opposite to each other. Using the synthetic ferrimagnet, the effective thickness of the free layer can be set thinner so that the magnetic field sensitivity is improved to achieve an increased head output. Such a synthetic ferrimagnet may also be applied to the ferromagnetic pinned layer 40.

Hereinafter, with reference to FIGS. 1A–1C and 2A–2D, the method of producing the TMR head of the present invention is explained.

As shown in FIG. 1A, the pinning layer 50, the ferromagnetic pinned layer 40, the tunnel barrier layer 30 and the non-magnetic metal protect layer 7 are formed in turn in a laminate fashion (laminating step). As to the lamination method, the sputtering method is generally used, though it is not limited thereto. As to the formation of the tunnel barrier layer 30, it is general that, after forming a film, an oxidizing process of the film is carried out for adding a function as a tunnel barrier. The pinning layer 50 is used as mean for pinning the magnetization direction of the ferromagnetic pinned layer 40.

The non-magnetic metal protect layer 7 is made of at least one material selected from Cu, Ag, Au and Al, and the thickness of the film is set to be in the range of about 20 to 100 Å. If the thickness exceeds 100 Å, a later-described cleaning process may tend to be difficult to achieve economically, and, if the thickness becomes less than 20 Å, it tends to be difficult to achieve a function as a protect layer. By providing the non-magnetic metal protect layer 7, almost no deterioration of the lamination body including magnetic layers arises even when the laminate body shown in FIG. 1A is once removed from the vacuum film forming chamber and exposed to the photoresist process. This is due to the fact that the pinning layer 50, the ferromagnetic pinned layer 40 and the tunnel barrier layer 30 are protected by the non-magnetic metal protect layer 7.

Figure 1B:
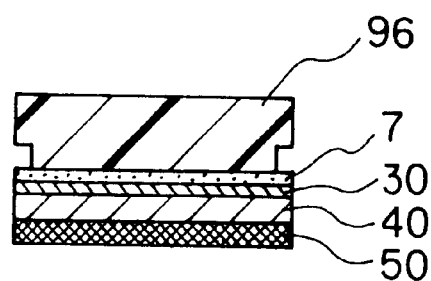
Figure 1C:
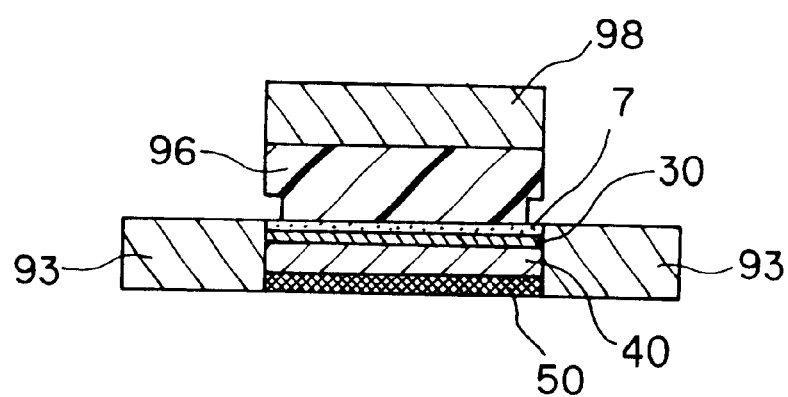

Then, as shown in FIG. 1B, a resist insulating layer 96 composed of resist resin is formed on the non-magnetic metal protect layer 7 using a photoresist method (operation). Thereafter, as shown in FIG. 1C, in the vacuum film forming chamber, the side insulating layers 93 and 93 made of alumina, for example, are formed on both sides of the lamination body comprising the ferromagnetic pinned layer 40, the tunnel barrier layer 30 and the non-magnetic metal protect layer 7, by a vacuum depositing method such as sputtering (insulating layer forming step). In this case, an insulating layer 98 composed of the material identical to that of the side insulation layers 93, 93 is also formed on the resist insulating layer 96. Then, the resist insulating layer 96 is lifted off and the insulating layer 98 is removed with the resist insulating layer 96, thus resulting in the state shown in FIG. 2A.

Then, the surface of the non-magnetic metal protect layer 7 is treated by the cleaning process. This cleaning process is achieved by dry etching the surface of the non-magnetic metal protect layer. As to the dry etching process, it is preferable to strike the surface of the non-magnetic metal protect layer 7 by, for example, argon plasma, argon ion beam etching, argon ECR (Electron cyclotron Resonance) etching, or RIE (Reactive Ion Etching), though it is not limited thereto. It is preferable to carry out the cleaning process to the extent that the following condition (1) or (2) is reached.

Figure 2A:
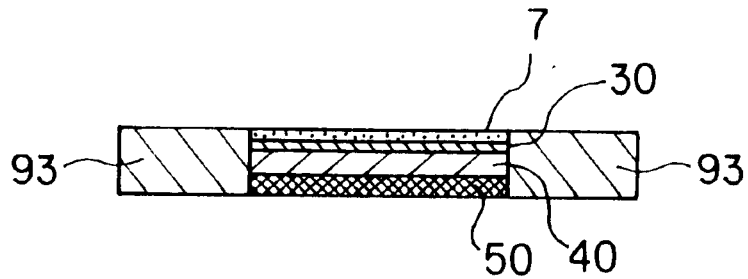
FIGS. 2A to 2D are sectional views showing, with a lapse of time, an example of a preferred manufacturing process of a magneto-resistive tunnel junction head according to the present invention.
Figure 2B:
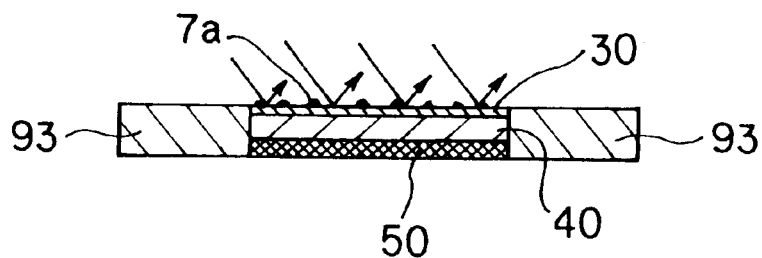

(1) completely removing the non-magnetic metal protect layer 7;

(2) attempting to remove the non-magnetic metal protect layer 7 as much as possible, resulting in the condition in which portions 7a of the non-magnetic metal protect layer 7 remain like islands (FIG. 2B). As to the residues 7a of the non-magnetic metal protect layer 7 (it is noted that the surface portion of the protect layer is completely removed), it has been confirmed that such residues do not have particular adverse effects to head characteristics. Through this cleaning process, the resist resin slightly adhering and remaining as impurities on the non-magnetic metal protect layer 7 is completely removed along with the non-magnetic metal protect layer 7.

If the non-magnetic metal protect layer 7 is not formed on the tunnel barrier layer 30, the resist resin adheres and remains directly on the tunnel barrier layer 30, and, if dry etching is performed to remove such resist, tunnel barrier layer 30 is greatly damaged.

Generally, not only the portion of the non-magnetic metal protect layer 7 but also the surfaces of the side insulating layers 93 and 93 are subjected to the cleaning process.

Figure 2C:
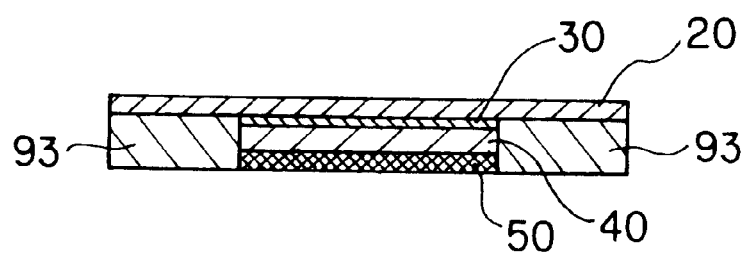

Then, as shown in FIG. 2C, a ferromagnetic free layer 20 is formed such that the ferromagnetic free layer 20 faces, via the cleaned surface, to a ferromagnetic pinned layer 40 (ferromagnetic free layer forming step). Specifically, the ferromagnetic free layer 20 is formed to cover both the surface processed by the cleaning process and the side insulating layers 93 and 93. Therefore, the longitudinal length of the ferromagnetic free layer 20 in the longitudinal direction (bias magnetic field applying direction) is set to be greater than the longitudinal length of the ferromagnetic pinned layer 40.

Figure 2D:
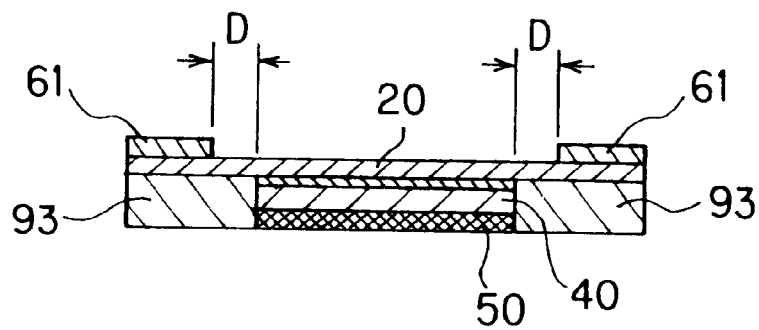

Then, as shown in FIG. 2D, biasing means 61 and 61 are provided such that the biasing means are disposed at and connected to both longitudinal opposite ends of the ferromagnetic free layer 20. In the head construction described above, it is preferable to set the foregoing space D to satisfy the foregoing range.

As described above, in the present invention, there is provided a method of producing a magneto-resistive tunnel junction head comprising a tunnel multilayered film having a tunnel barrier layer, a ferromagnetic free layer and a ferromagnetic pinned layer such that the tunnel barrier layer is held between the ferromagnetic free layer and the ferromagnetic pinned layer, wherein the method comprises a laminating step of forming the tunnel barrier layer and a non-magnetic metal protect layer in turn on the ferromagnetic pinned layer, an insulating layer forming step of forming side insulating layers on both sides of a lamination body having the ferromagnetic pinned layer, the tunnel barrier layer and the non-magnetic metal protect layer, a cleaning step of cleaning the surface of the non-magnetic metal protect layer, and a ferromagnetic free layer forming step of forming the ferromagnetic free layer such that the ferromagnetic free layer faces the ferromagnetic pinned layer via the cleaned surface. Therefore, 2-step-deposition (specifically, forming the ferromagnetic pinned layer in one step and forming the ferromagnetic free layer in another step) can be achieved without damaging the tunnel barrier layer, and, there can be obtained the improved tunnel multilayered film and the large head output. In addition, the so-called "extra current channel effect" can be prevented to improve the head output.

What is claimed is:

1. A method of producing a magneto-resistive tunnel junction head comprising a tunnel multilayered film having a tunnel barrier layer, a ferromagnetic free layer and a ferromagnetic pinned layer such that the tunnel barrier layer is held between the ferromagnetic free layer and the ferromagnetic pinned layer, said method comprising:

a laminating step of forming the tunnel barrier layer and a non-magnetic metal protect layer on said ferromagnetic pinned layer;

an insulating layer forming step of forming side insulating layers on both longitudinal sides of a lamination body having said ferromagnetic pinned layer, said tunnel barrier layer and said non-magnetic metal protect layer;

a cleaning step of cleaning the surface of said nonmagnetic metal protect layer to produce a cleaned surface; and a ferromagnetic free layer forming step of depositing the ferromagnetic free layer such that the ferromagnetic free layer faces over said cleaned surface and that it faces said ferromagnetic pinned layer.

2. The method of producing the magneto-resistive tunnel junction head according to claim 1, wherein said cleaning step is carried out with a dry etching technique until said non-magnetic metal protect layer is completely removed.

3. The method of producing the magneto-resistive tunnel junction head according to claim 1, wherein said cleaning step is carried out with a dry etching technique until portions of said non-magnetic metal protect layer remain like islands.

4. The method of producing the magneto-resistive tunnel junction head according to claim 1, wherein said non-magnetic metal protect layer is made of at least one element selected from the group consisting of Cu, Ag, Au and Al.

5. The method of producing the magneto-resistive tunnel junction head according to claim 4, wherein the thickness of the non-magnetic metal protect layer is set to be in the range of 20 to 100 Å.

6. The method of producing the magneto-resistive tunnel junction head according to claim 1, wherein a pinning layer for pinning magnetization of said ferromagnetic pinned layer is stacked on a surface of said ferromagnetic pinned layer remote from a side thereof abutting said tunnel barrier layer.

7. The method of producing the magneto-resistive tunnel junction head according to claim 1, wherein said tunnel multilayered film is electrically contacted with a pair of electrodes which are disposed to sandwich said tunnel multilayered film therebetween.

8. The method of producing the magneto-resistive tunnel junction head according to claim 7, wherein a pair of shield layers are formed to sandwich said pair of electrodes therebetween.

9. A method of producing a magneto-resistive tunnel junction head comprising a tunnel multilayered film having a tunnel barrier layer, a ferromagnetic free layer and a ferromagnetic pinned layer such that said tunnel barrier layer is held between said ferromagnetic free layer and said ferromagnetic pinned layer, wherein said ferromagnetic free layer is applied with a bias magnetic field in a longitudinal direction thereof by biasing means disposed at and connected to longitudinal opposite ends thereof, and wherein a length of the ferromagnetic free layer in the longitudinal direction, bias magnetic field applying direction, thereof is set to be greater than a longitudinal length of the ferromagnetic pinned layer such that the ferromagnetic free layer is provided at the longitudinal opposite ends thereof with extended portions extending further beyond longitudinal opposite ends of the ferromagnetic pinned layer, said method comprising:

a laminating step of forming the tunnel barrier layer over a ferromagnetic pinned layer and a non-magnetic metal protect layer over the tunnel barrier layer;

an insulating layer forming step of forming side insulating layers on both longitudinal sides of a lamination body having said ferromagnetic pinned layer, said tunnel barrier layer and said non-magnetic metal protect layer;

a cleaning step of cleaning the surface of said nonmagnetic metal protect layer to produce a cleaned surface;

a ferromagnetic free layer forming step of depositing the ferromagnetic free layer such that the ferromagnetic free layer faces over said cleaned surface such that it faces said ferromagnetic pinned layer; and a biasing means forming step of providing the biasing means such that the biasing means are disposed at and connected to both longitudinal opposite ends of the ferromagnetic free layer.

10. The method of producing the magneto-resistive tunnel junction head according to claim 9, wherein said cleaning step is carried out with a dry etching technique until said non-magnetic metal protect layer is completely removed.

11. The method of producing the magneto-resistive tunnel junction head according to claim 9, wherein said cleaning step is carried out with a dry etching technique until portions of said non-magnetic metal protect layer remain like islands.

12. The method of producing the magneto-resistive tunnel junction head according to claim 9, wherein said non-magnetic metal protect layer is made of at least one selected from the group consisting of Cu, Ag, Au and Al.

13. The method of producing the magneto-resistive tunnel junction head according to claim 12, wherein the thickness of the non-magnetic metal protect layer is set to be in the range of 20 to 100 Å.

14. The method of producing the magneto-resistive tunnel junction head according to claim 9, wherein said biasing means located at the longitudinal opposite ends of the ferromagnetic free layer are contacted with upper or lower portions of the extended portions located at the longitudinal opposite ends of the ferromagnetic free layer, and wherein each of the biasing means is located with a predetermined space from corresponding one of the longitudinal opposite ends of the ferromagnetic pinned layer, said space being set to no less than 0.02 $\mu$m.

15. The method of producing the magneto-resistive tunnel junction head according to claim 14, wherein said space is set to no less than 0.02 $\mu$m and no greater than 0.3 $\mu$m.

16. The method of producing the magneto-resistive tunnel junction head according to claim 14, wherein said space is set to no less than 0.02 $\mu$m and less than 0.15 $\mu$m.

17. The method of producing the magneto-resistive tunnel junction head according to claim 9, wherein a pinning layer for pinning magnetization of said ferromagnetic pinned layer is stacked on a surface of said ferromagnetic pinned layer remote from a side thereof abutting said tunnel barrier layer.

18. The method of producing the magneto-resistive tunnel junction head according to claim 9, wherein said tunnel multilayered film is electrically contacted with a pair of electrodes which are disposed to sandwich said tunnel multilayered film therebetween.

19. The method of producing the magneto-resistive tunnel junction head according to claim 18, wherein a pair of shield layers are formed to sandwich said pair of electrodes therebetween.

* * * * *